United States Patent
Park et al.

(10) Patent No.: US 8,990,652 B2
(45) Date of Patent: Mar. 24, 2015

(54) METHOD AND APPARATUS FOR CONTROLLING ITERATIVE DECODING IN A TURBO DECODER

(75) Inventors: Hee-Young Park, Seoul (KR); Hun-Kee Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 640 days.

(21) Appl. No.: 12/947,106

(22) Filed: Nov. 16, 2010

(65) Prior Publication Data

US 2011/0119552 A1    May 19, 2011

(30) Foreign Application Priority Data

Nov. 17, 2009  (KR) .................. 10-2009-0111003

(51) Int. Cl.
| | |
|---|---|
| H03M 13/00 | (2006.01) |
| H04L 1/18 | (2006.01) |
| H03M 13/29 | (2006.01) |
| H03M 13/37 | (2006.01) |
| H04L 1/00 | (2006.01) |

(52) U.S. Cl.
CPC ...... *H03M 13/2975* (2013.01); *H03M 13/3753* (2013.01); *H03M 13/6306* (2013.01); *H03M 13/6525* (2013.01); *H04L 1/0051* (2013.01); *H04L 1/1812* (2013.01); *H04L 1/1845* (2013.01)
USPC .......................................................... 714/751

(58) Field of Classification Search
None
See application file for complete search history.

(56) References Cited

U.S. PATENT DOCUMENTS

| | | | | |
|---|---|---|---|---|
| 2004/0139378 | A1* | 7/2004 | Akhter et al. .................. | 714/755 |
| 2006/0023815 | A1* | 2/2006 | Malm ........................... | 375/340 |
| 2007/0189227 | A1* | 8/2007 | Lotter et al. .................. | 370/332 |
| 2008/0148133 | A1* | 6/2008 | Duggan ........................ | 714/796 |
| 2009/0110122 | A1* | 4/2009 | Eun et al. ...................... | 375/340 |
| 2011/0113294 | A1* | 5/2011 | Chugg et al. .................. | 714/704 |
| 2012/0017133 | A1* | 1/2012 | Papageorgiou ............... | 714/752 |
| 2013/0132791 | A1* | 5/2013 | Alrod et al. ................... | 714/752 |

* cited by examiner

*Primary Examiner* — Gabriel Chu
(74) *Attorney, Agent, or Firm* — Jefferson IP Law, LLP

(57) ABSTRACT

A method and apparatus for controlling iterative decoding in a turbo decoder are provided, in which a maximum number of iterations is determined for current data to be decoded based on at least one of current HARQ information necessary for a HARQ operation of the current data, previous HARQ information about previous data, and early stop information indicating whether iterative decoding of the previous data was early stopped. A turbo decoder iteratively decodes the current data within the maximum number of iterations.

24 Claims, 6 Drawing Sheets

METHOD AND APPARATUS FOR CONTROLLING ITERATIVE DECODING IN A TURBO DECODER

PRIORITY

This application claims the benefit under 35 U.S.C. §119(a) of a Korean patent application filed in the Korean Intellectual Property Office on Nov. 17, 2009 and assigned Serial No. 10-2009-0111003, the entire disclosure of which is hereby incorporated by reference.

BACKGROUND OF THE INVENTION

1. Field of the Invention

The present invention relates to a turbo decoder. More particularly, the present invention relates to a method and apparatus for controlling iterative decoding in a turbo decoder.

2. Description of the Related Art

For wireless communication, Forward Error Correction (FEC) is used to correct bursty errors of a radio channel. A major example of FEC codes is turbo code. It is known that efficiency closest to the theoretical maximum channel capacity can be achieved by configuring a turbo encoder with two component encoders and an interleaver.

A turbo decoder is the counterpart of a turbo encoder, and generally includes two component decoders serially connected to each other. The turbo decoder iterates decoding by feeding back the output of the second component decoder to the input of the first component decoder, thus increasing decoding efficiency. This scheme is called iterative turbo decoding or turbo iteration.

To maximize the effects of iterative turbo decoding, it is preferable to set the maximum number of iterations to a substantially large number. Without limitations on system resources, overall system performance increases with the number of turbo iterations. Accordingly, if there is no limit on resources and no problems such as heat emission from hardware occur, the number of turbo iterations may be set to a large number. If the maximum number of iterations is large enough, Cyclic Redundancy Check (CRC) decoding performance can be maximized.

However, if heat emission needs to be reduced or receiver resources are limited, as is generally the case for software modems, the number of turbo iterations necessary to achieve a required performance is not ensured. Conventionally, the maximum number of turbo iterations is fixed, taking into account a total system computation volume and a memory capacity. This conventional technology has limitations in its effectiveness to improve turbo iteration-based performance.

SUMMARY OF THE INVENTION

An aspect of the present invention is to address at least the above-mentioned problems and/or disadvantages and to provide at least the advantages described below. Accordingly, an aspect of the present invention is to provide a method and apparatus for increasing retransmission efficiency by adjusting the number of iterations in a turbo decoder.

Another aspect of the present invention is to provide a method and apparatus for controlling iterative decoding of a turbo decoder according to an Automatic Repeat reQuest (ARQ) operation.

Another aspect of the present invention is to provide a method and apparatus for adjusting the number of decoding iterations in conjunction with an ARQ operation.

A further aspect of the present invention is to provide a method and apparatus for reducing a frame error rate and improving system performance by adaptively adjusting the number of decoding iterations through weighting of each retransmission.

In accordance with an aspect of the present invention, a method for controlling iterative decoding in a turbo decoder is provided. The method includes determining a maximum number of iterations for current data to be decoded based on current Hybrid Automatic Repeat reQuest (HARQ) information necessary for a HARQ operation of the current data and previous HARQ information about previous data, and iteratively decoding the current data within the maximum number of iterations.

In accordance with another aspect of the present invention, an apparatus for controlling iterative decoding is provided. The apparatus includes a controller for determining a maximum number of iterations for current data to be decoded based on current HARQ information necessary for a HARQ operation of the current data and previous HARQ information about previous data, and a turbo decoder iteratively decodes the current data within the maximum number of iterations.

In accordance with another aspect of the present invention, a method for controlling iterative decoding is provided. The method includes determining whether current data to be decoded is retransmission data based on current HARQ information necessary for a HARQ operation of the current data, determining whether the current data corresponds to a last transmission of a specific encoded packet when the current data is retransmission data, determining a maximum number of iterations for the current data by incrementing a predetermined value by a predetermined unit when the current data is retransmission data and corresponds to the last transmission of the specific encoded packet, and the iteratively decoding the current data within the maximum number of iterations.

In accordance with a further aspect of the present invention, an apparatus for controlling iterative decoding is provided. The apparatus includes a controller for determining whether current data to be decoded is retransmission data based on current HARQ information necessary for a HARQ operation of the current data, determining whether the current data corresponds to a last transmission of a specific encoded packet when the current data is retransmission data, and determining a maximum number of iterations for the current data by incrementing a predetermined value by a predetermined unit when the current data is retransmission data and corresponds to the last transmission of the specific encoded packet; and a turbo decoder for iteratively decoding the current data within the maximum number of iterations.

According to another aspect of the present invention, a method of decoding HARQ data is provided. The method includes receiving the HARQ data, determining a maximum number of decoding iterations, turbo decoding the HARQ data within the determined maximum number of iterations, transmitting an ACK response when the HARQ data was successfully decoded, and transmitting a NACK response when the HARQ data was not successfully decoded.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, like reference numerals will be understood to refer to like parts, components, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding, but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The following description will be given of an operation for controlling iterative decoding in a turbo decoder in compliance with the $3^{rd}$ Generation Partnership Project (3GPP) Long Term Evolution (LTE) Evolution Data Only (EVDO) standard. However, the iterative decoding operation according to exemplary embodiments of the present invention is not limited to a specific communication protocol or system configuration. Therefore, it is to be clearly understood to those skilled in the art that many modifications can be made within the scope and spirit of the present invention.

Figure 1:
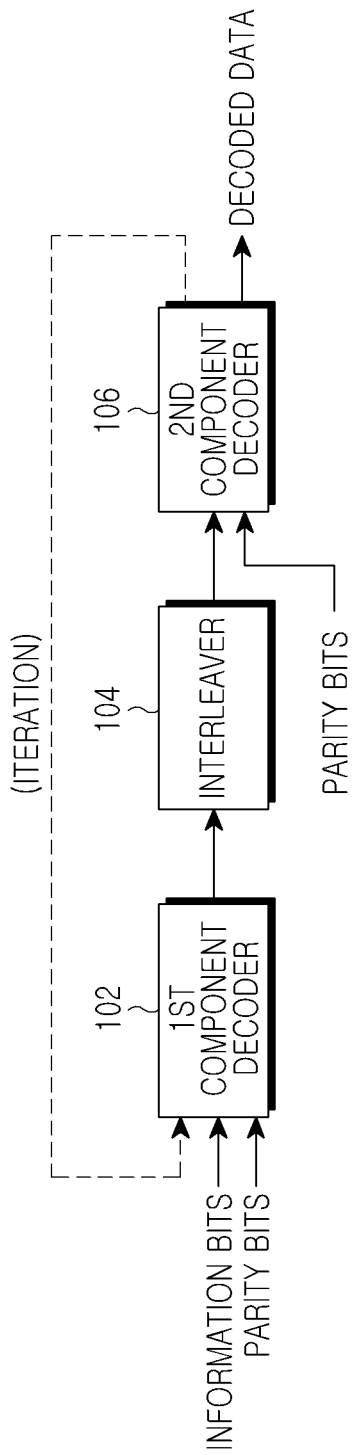
FIG. 1 is a block diagram of a turbo decoder according to an exemplary embodiment of the present invention.

FIG. 1 is a block diagram of a turbo decoder according to an exemplary embodiment of the present invention.

Referring to FIG. 1, information bits and parity bits of received data are input to a first component decoder 102. The output of the first component decoder 102 is input to a second component decoder 106 through an interleaver 104. The second component decoder 106 decodes the output of the interleaver 104 and additionally received parity bits and outputs the decoded data. If the turbo decoding is iterated, the decoded data of the second component decoder 106 is fed back to the first component decoder 102 and the decoded data is decoded within a predetermined maximum number of iterations. In case of an early stop, if an early stop condition is satisfied, the iterative decoding may be terminated even through the number of iterations has not reached the maximum number of iterations.

Figure 2:
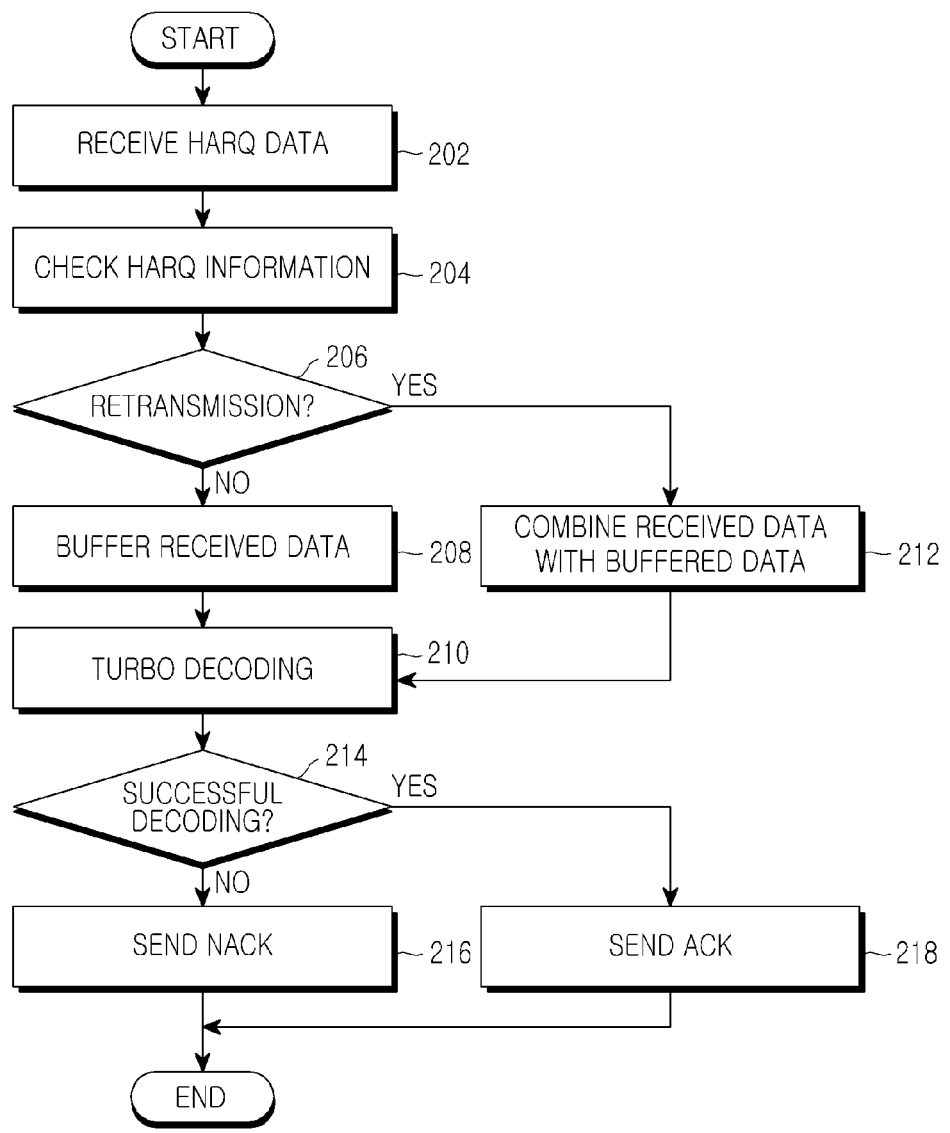
FIG. 2 is a flowchart illustrating a decoding operation of a turbo decoder using a fixed number of iterations according to an exemplary embodiment of the present invention.

FIG. 2 is a flowchart illustrating a decoding operation of a turbo decoder using a fixed number of iterations according to an exemplary embodiment of the present invention. The decoding operation is carried out by a receiver having a turbo decoder and a controller.

Referring to FIG. 2, Hybrid Automatic Repeat reQuest (HARQ) data is received on a data channel in step 202. The HARQ data is generated by encoding one packet for each HARQ transmission. The HARQ data is either initial transmission data of the packet or at least one retransmission data of the packet. In step 204, the receiver checks HARQ information related to the HARQ data. The HARQ information indicates whether the HARQ data is initial transmission data or retransmission data and indicates the retransmission number of the HARQ data. For example, the HARQ information may include a Retransmission Version (RV) indicating a retransmission number. The receiver determines whether the HARQ data is retransmission data based on the HARQ information in step 206. If the HARQ data is retransmission data, the receiver goes to step 212. If HARQ data is initial transmission data, the receiver goes to step 208.

The receiver buffers the HARQ data in a HARQ buffer in step 208 and turbo-decodes the buffered HARQ data within a fixed maximum number of times predetermined for the HARQ data in step 210. In step 212, the receiver combines the HARQ data with pre-stored data and buffers the combined data in the HARQ buffer. Then the receiver turbo-decodes the combined data within the maximum number of iterations.

The receiver determines whether the turbo decoding is successful in step 214. If the decoded data is free of errors (i.e., successful), the receiver transmits an ACK signal to a transmitter in step 218. If the decoded data has an error, the receiver transmits a Negative-ACK (NACK) signal to the transmitter in step 216.

Where the same maximum number of iterations is set irrespective of HARQ retransmission as described above, turbo decoding may be iterated the maximum number of times even though HARQ transmission efficiency is low. To overcome this inefficiency, the maximum number of iterations is adjusted according to HARQ information. A description will now be given of an operation for changing the maximum number of iterations for an initial transmission and a last transmission according to an exemplary embodiment of the present invention.

Figure 3:
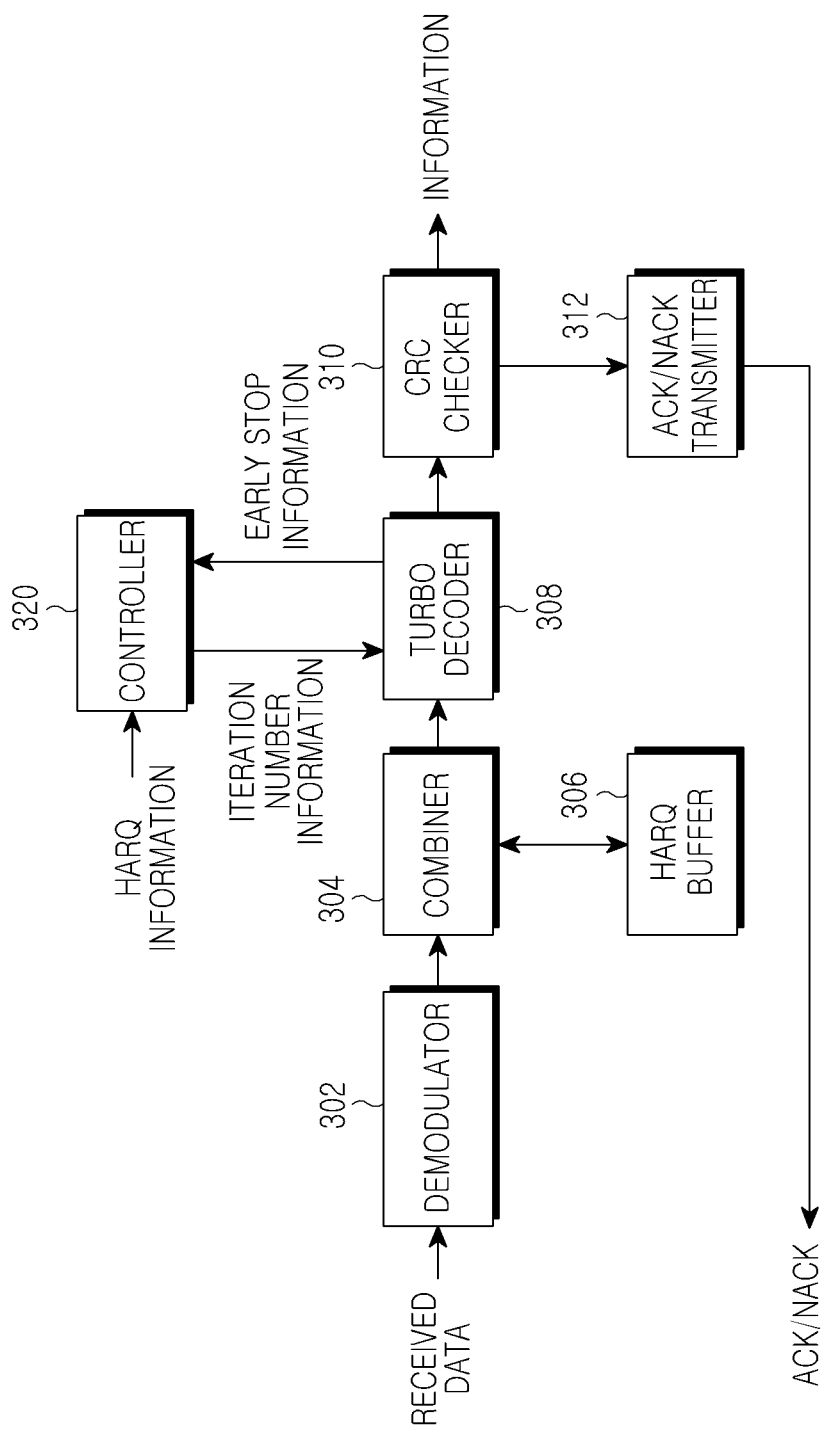
FIG. 3 is a block diagram of a receiver according to an exemplary embodiment of the present invention.

FIG. 3 is a block diagram of a receiver according to an exemplary embodiment of the present invention.

Referring to FIG. 3, a demodulator 302 demodulates data received on a radio channel from a transmitter. If the demodulated data received from the demodulator 302 is initial transmission data, a combiner 304 buffers the demodulator in a HARQ buffer 306. If the demodulated data is retransmission data, the combiner 304 combines the demodulated data with the same data already buffered in the HARQ buffer 306 and then buffers the combined data in the HARQ buffer 306. The determination is made as to whether the demodulated data is initial transmission data or retransmission data based on HARQ information about the received data. The combiner 304 outputs to a turbo decoder 308 the demodulated data in the case of the initial transmission data and the combined data in the case of the retransmission data.

The turbo decoder 308, which may be configured as illustrated in FIG. 1, performs iterative decoding on the received data within a predetermined maximum number of iterations. The maximum number of iterations is controlled by the controller 320 according to HARQ information. A CRC checker 310 checks the CRC of the decoded data received from the turbo decoder 308, determines whether the decoded data has an error, and outputs the result to an ACK/NACK transmitter 312. If the CRC is free of errors, the ACK/NACK transmitter 312 feeds back an ACK signal to the transmitter. If the CRC has an error, the ACK/NACK transmitter 312 feeds back a NACK signal to the transmitter.

An operation for adjusting the maximum number of iterations in the controller 320 of the receiver having the above configuration will be described in more detail later.

Figure 4:
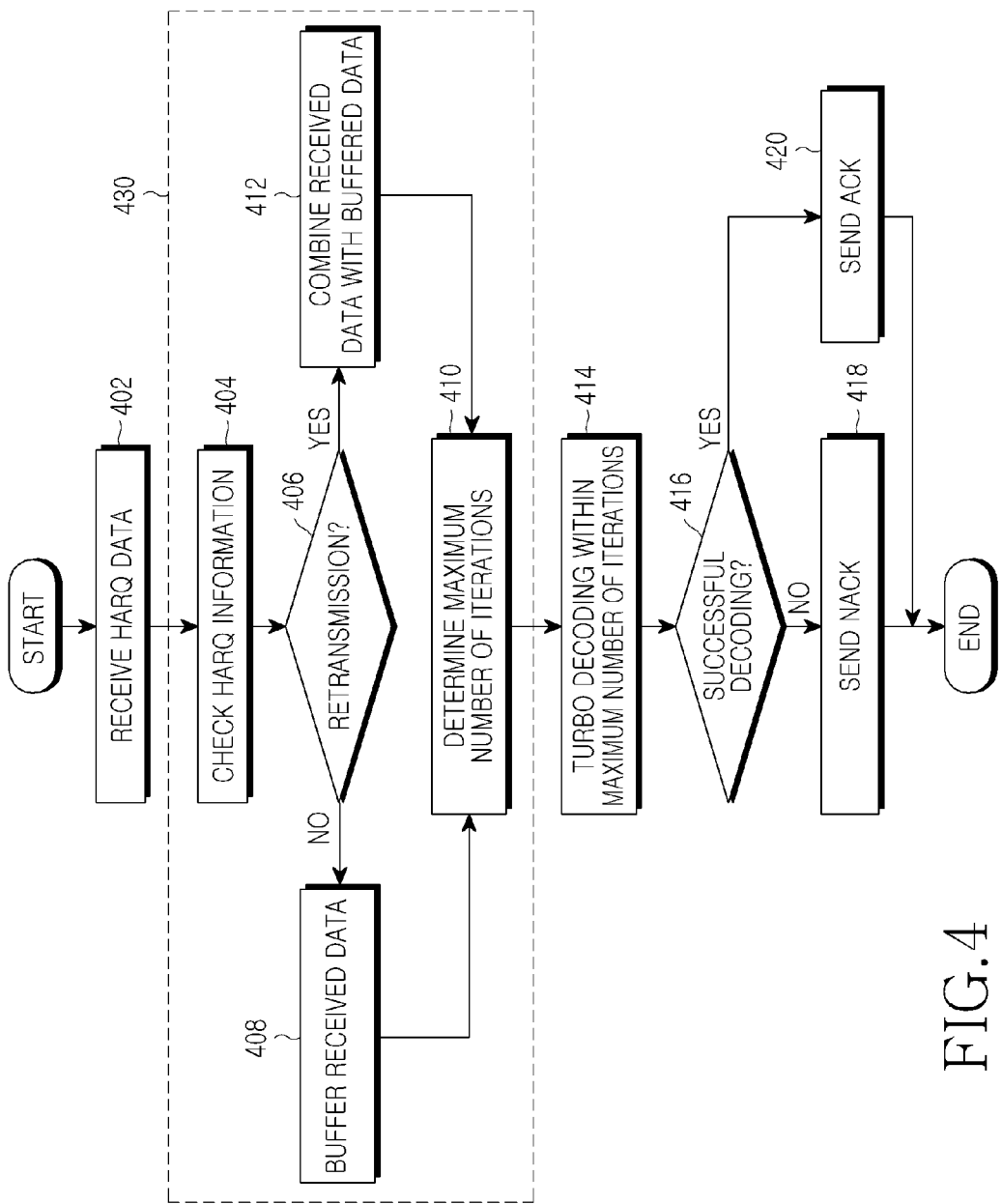
FIG. 4 is a flowchart illustrating a reception operation according to an exemplary embodiment of the present invention.

FIG. 4 is a flowchart illustrating a reception operation according to an exemplary embodiment of the present invention. The reception operation is performed by a receiver having a turbo decoder and a controller.

Referring to FIG. 4, HARQ data is received on a data channel in step 402. The HARQ data is generated by encoding one packet for each HARQ transmission. That is, the HARQ data is one of initial transmission data of the packet and at least one retransmission data of the packet. In step 404, the receiver checks HARQ information related to the HARQ data. The HARQ information indicates whether the HARQ data is initial transmission data or retransmission data and indicates the retransmission number of the HARQ data. For example, the HARQ information includes a Retransmission Version (RV) indicating a retransmission number. The HARQ information may be received along with the HARQ data or on a control channel separately from the data channel. The receiver determines whether the HARQ data is retransmission data based on the HARQ information in step 406. If the HARQ data is retransmission data, the receiver goes to step 412. If the HARQ data is initial transmission data, the receiver goes to step 408.

The receiver buffers the HARQ data in a HARQ buffer in step 408 and determines a maximum number of iterations for turbo decoding of the HARQ data in step 410. The maximum number of iterations may be adjusted based on the current HARQ information, previous HARQ information, and early stop information about the turbo decoder. In step 412, the receiver combines the HARQ data with pre-stored data and buffers the combined data in the HARQ buffer. The receiver determines a maximum number of iterations for turbo decoding of the combined data in step 410. Step 410 for determining the maximum number of iterations will be described later with reference to FIG. 5.

After step 410, the HARQ data (i.e. the initial transmission data) or the combined data (i.e. the retransmission data) are turbo-decoded within the determined maximum number of iterations in step 414. The receiver determines whether the turbo decoding is successful in step 416. If the decoded data is free of errors (i.e., successful), the receiver transmits an ACK to a transmitter in step 420. If the decoded data has an error, the receiver transmits a NACK signal to the transmitter in step 418.

Figure 5:
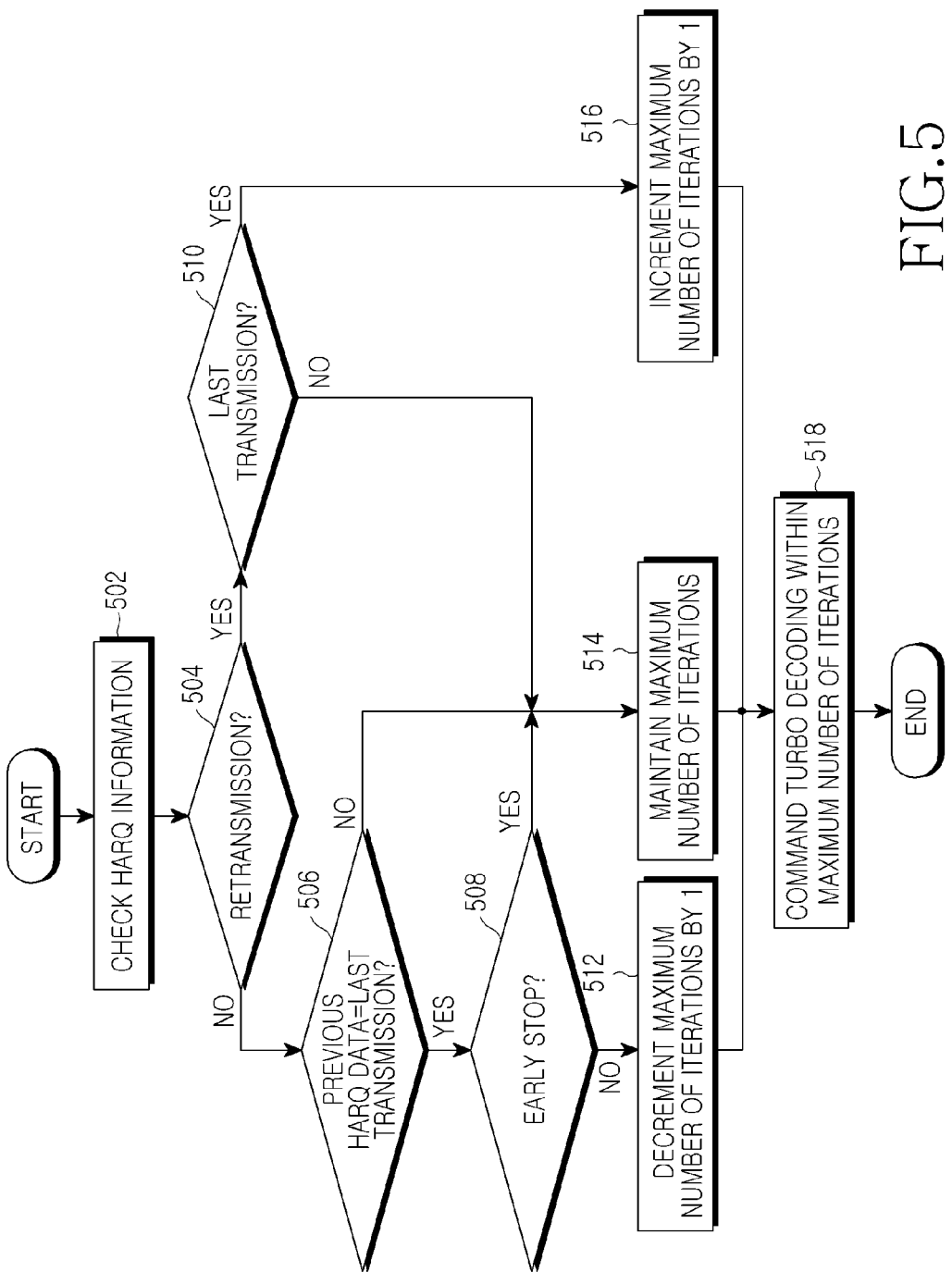
FIG. 5 is a flowchart illustrating an operation for adjusting a maximum iteration number according to an exemplary embodiment of the present invention.

FIG. 5 is a flowchart illustrating an operation for adjusting a maximum iteration number according to an exemplary embodiment of the present invention. This operation is performed for the turbo decoder by the controller.

Referring to FIG. 5, the controller checks HARQ information (i.e. current HARQ information) about currently received HARQ data in step 502 and determines whether the HARQ data is initial transmission data or retransmission data based on the current HARQ information in step 504. If the HARQ data is initial transmission data, the controller proceeds to step 506 to determine whether to reduce or maintain the maximum number of iterations. If the HARQ data is retransmission data, the controller goes to step 510 to determine whether to increase or maintain the maximum number of iterations.

In step 510, the controller determines whether the current HARQ information indicates the last transmission of a specific packet. For example, if the HARQ RV included in the current HARQ information is equal to a predetermined maximum number of retransmissions, the controller considers that the current HARQ data corresponds to the last transmission of the packet. If the current HARQ data does not correspond to the last transmission of the packet, a predetermined maximum number of iterations (M) is maintained as a maximum number of iterations for the current HARQ data in step 514. The predetermined maximum number of iterations (M) is a default value set for HARQ data or a HARQ connection in software or hardware in a modem. According to another exemplary embodiment of the present invention, a previously determined (or adjusted) maximum number of iterations is maintained, not the predetermined maximum number of iterations (M), as the maximum number of iterations for the current HARQ data.

If the current HARQ data corresponds to the last transmission of the packet, the controller increments the predetermined maximum number of iterations (M) by a predetermined unit, for example, by 1 (M'=M+1) in step 516. According to another exemplary embodiment of the present invention, the controller may increment the previous maximum number of iterations by a predetermined unit (e.g. 1). The reason for increasing the maximum number of iterations is to increase decoding efficiency because the current transmission is the last decoding opportunity for the specific packet.

The controller checks HARQ information (previous HARQ information) about previously received HARQ data (previous HARQ data) and determines whether the previous HARQ information is the last transmission of a specific packet in step 506. For example, if the HARQ RV set in the previous HARQ information is equal to a predetermined maximum number of retransmissions, the controller considers that the previous HARQ data corresponds to the last transmission of the packet. If the previous HARQ data does not correspond to the last transmission of the packet, the controller maintains the maximum number of iterations in step 514. If the previous HARQ data corresponds to the last transmission of the packet, the controller goes to step 508.

In step 508, the controller determines whether the iterative turbo decoding of the previous HARQ data was stopped early. The controller receives from the turbo decoder early stop information indicating whether the iterative turbo decoding of HARQ data was stopped early. Upon receipt of the next HARQ data, the controller performs step 508 according to the early stop information. If early stop was applied to the previous transmission, that is, if the iterative decoding of the previous HARQ data was stopped early according to a predetermined condition, the controller determines to maintain the predetermined maximum number of iterations (M) as the maximum number of iterations for the current HARQ data in step 514. If early stop was not applied to the previous transmission, the controller decrements the predetermined maximum number of iterations (M) by a predetermined unit, for example, 1 (M'=M−1) in step 512. This is done to prevent an excessive increase in the total number of decoding iterations for one packet. According to another exemplary embodiment of the present invention, the controller may decrement the previously adjusted maximum number of iterations by a predetermined unit (e.g. 1) repeatedly. Thus, it is possible to restrict the sum of maximum numbers of iterations for the total transmissions of one packet.

Figure 6:
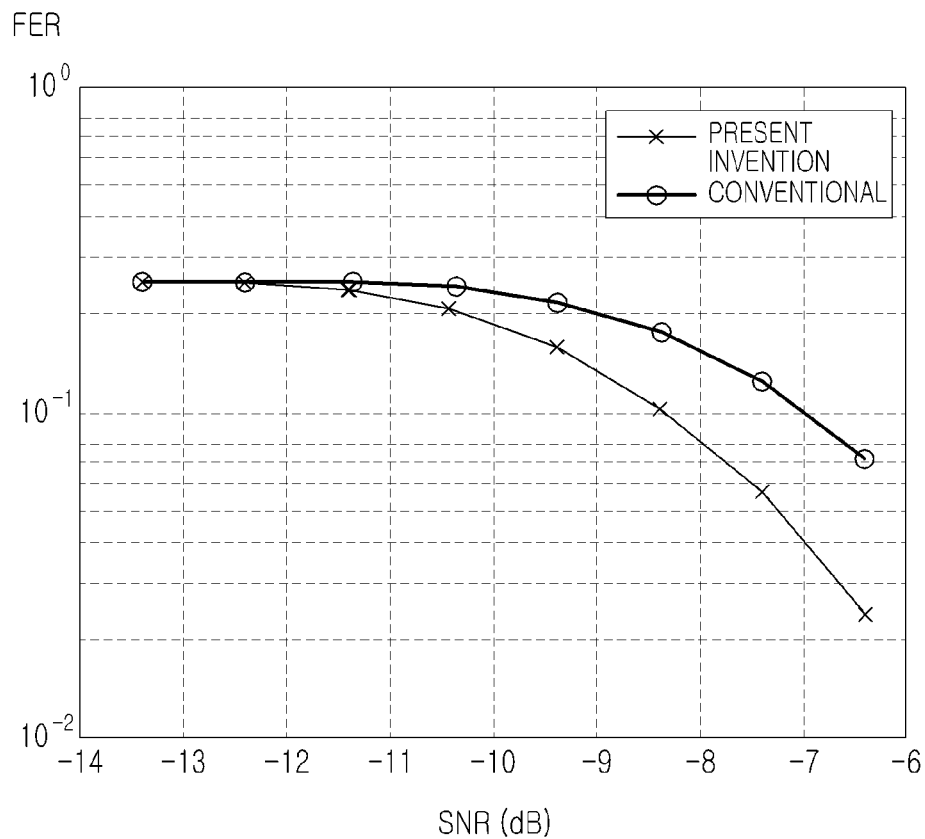
FIG. 6 is a graph illustrating performance with respect to the Frame Error Rate (FER) of turbo decoding results according to an exemplary embodiment of the present invention.

FIG. 6 is a graph illustrating performance with respect to the Frame Error Rate (FER) of turbo decoding results according to an exemplary embodiment of the present invention. A conventional turbo decoding scheme using a maximum number of iterations fixed to '4' is compared with the turbo decoding scheme of the present invention in which a maximum number of iterations is adaptively adjusted, in terms of FER.

Referring to FIG. 6, if the maximum number of retransmissions is '4' and the maximum number of iterations is '4', turbo decoding takes place four times for each HARQ transmission of a specific packet. Accordingly, up to 4×4 turbo decodings are performed to receive the packet. On the other hand, when the maximum number of iterations is adjusted for each HARQ transmission according to an exemplary embodiment of the present invention, FER reduction performance versus Signal-to-Noise Ratio (SNR) increase is improved in the present invention, relative to the conventional scheme.

The operations according to the above exemplary embodiment of the present invention can be realized by providing a memory device that has stored associated program code in each node that conducts communication. Each communication node can carry out the above-described operations by reading the program code from the memory device by a processor or a Central Processing Unit (CPU). As is apparent from the above description of the present invention, FER performance and system throughput can be improved by adaptively adjusting the number of turbo decoding iterations according to an ARQ operation.

Exemplary embodiments of the present invention can also be embodied as computer-readable codes on a computer-readable recording medium. The computer-readable recording medium is any data storage device that can store data which can thereafter be read by a computer system. Examples of the computer-readable recording medium include, but are not limited to, read-only memory (ROM), random-access memory (RAM), CD-ROMs, magnetic tapes, floppy disks, and optical data storage devices. Also, function programs, codes, and code segments for accomplishing the present invention can be easily construed as within the scope of the invention by programmers skilled in the art to which the present invention pertains.

While the invention has been shown and described with reference to certain exemplary embodiments thereof, it will be understood by those skilled in the art that various changes in form and details may be made therein without departing from the spirit and scope of the present invention as defined by the appended claims and their equivalents.

What is claimed is:

1. A method for controlling iterative decoding in a turbo decoder, the method comprising:
    determining a maximum number of iterations for current data to be decoded based on current Hybrid Automatic Repeat reQuest (HARQ) information necessary for a HARQ operation of the current data and previous HARQ information about previous data; and
    iteratively decoding the current data within the maximum number of iterations for the current data,
    wherein the determining of the maximum number of iterations comprises determining the maximum number of iterations for the current data based on early stop information indicating whether the iterative decoding of the previous data was stopped before a maximum number of iterations for the previous data, and
    wherein the early stop information is applied when the current data is initial transmission data and the previous data is last transmission data of a specific packet.

2. The method of claim 1, wherein each of the current HARQ information and the previous HARQ information includes a HARQ Retransmission Version (RV) indicating a retransmission number of the current data or the previous data.

3. The method of claim 1, wherein the determination comprises:
    determining whether the current data is initial transmission data or retransmission data according to the current HARQ information;
    determining whether the current data corresponds to a last transmission of a specific encoded packet when the current data is retransmission data; and
    incrementing the maximum number of iterations for the current data by a predetermined unit when the current data corresponds to the last transmission.

4. The method of claim 3, wherein the determination further comprises maintaining the maximum number of iterations for the current data when the current data does not correspond to the last transmission of the specific encoded packet.

5. The method of claim 1, wherein the determination comprises:
    determining whether the previous data corresponds to a last transmission of a specific packet according to the previous HARQ information; and
    determining whether early stop was applied to iterative decoding of the previous data when the previous data corresponds to the last transmission of the specific packet; and
    decrementing the maximum number of iterations for the current data by a predetermined unit when the previous data corresponds to the last transmission of the specific packet and the early stop was not applied to the iterative decoding of the previous data.

6. The method of claim 5, wherein the determination further comprises maintaining the maximum number of iterations for the current data when the previous data does not correspond to the last transmission of the specific packet or the early stop was applied to the iterative decoding of the previous data.

7. The method of claim 1, wherein the previous HARQ information is received along with the previous data or on a control channel separately from a data channel and the current HARQ information is received along with the current data or on a control channel separately from a data channel.

8. The method of claim 1, wherein each of the current HARQ information and the previous HARQ information indicates whether each transmission of the current data and the previous data is an initial transmission or a retransmission.

9. The method of claim 8, wherein if each transmission of the current data and the previous data is a retransmission, each of the current HARQ information and the previous HARQ information indicates whether each transmission of the current data and the previous data is last retransmission or not.

10. An apparatus for controlling iterative decoding, the apparatus comprising:
    a controller configured to determine a maximum number of iterations for current data to be decoded based on current Hybrid Automatic Repeat reQuest (HARQ) information necessary for a HARQ operation of the current data and previous HARQ information about the previous data; and a turbo decoder configured to iteratively decode the current data within the maximum number of iterations for the current data, wherein the controller determines the maximum number of iterations for the current data based on early stop information indicating whether the iterative decoding of the previous data was stopped before the maximum number of iterations for the previous data, and wherein the early stop information is applied when the current data is initial transmission data and the previous data is last transmission data of a specific packet.

11. The apparatus of claim 10, wherein each of the current HARQ information and the previous HARQ information includes a HARQ Retransmission Version (RV) indicating a retransmission number of the current data or the previous data.

12. The apparatus of claim 10, wherein the controller increments the maximum number of iterations for the current data by a predetermined unit when the current data is retransmission data and corresponds to a last transmission of a specific packet.

13. The apparatus of claim 12, wherein the controller maintains the maximum number of iterations for the current data when the current data is retransmission data and does not correspond to the last transmission of the specific encoded packet.

14. The apparatus of claim 10, wherein the controller decrements the maximum number of iterations for the current data by a predetermined unit when the previous data corresponds to a last transmission of a specific packet and early stop was not applied to iterative decoding of the previous data.

15. The apparatus of claim 14, wherein the controller maintains the maximum number of iterations for the current data when the previous data does not correspond to the last transmission of the specific packet or the early stop was applied to the iterative decoding of the previous data.

16. The apparatus of claim 10, wherein the previous HARQ information is received along with the previous data or on a control channel separately from a data channel and the current HARQ information is received along with the current data or on a control channel separately from a data channel.

17. The apparatus of claim 10, wherein each of the current HARQ information and the previous HARQ information indicates whether each transmission of the current data and the previous data is an initial transmission or a retransmission.

18. The apparatus of claim 17, wherein if each transmission of the current data and the previous data is a retransmission, each of the current HARQ information and the previous HARQ information indicates whether each transmission of the current data and the previous data is last retransmission or not.

19. A method for controlling iterative decoding in a turbo decoder, the method comprising:

determining whether current data to be decoded is retransmission data based on current Hybrid Automatic Repeat reQuest (HARQ) information necessary for a HARQ operation of the current data;

determining whether the current data corresponds to a last transmission of a specific encoded packet when the current data is retransmission data;

determining a maximum number of iterations for the current data by incrementing a predetermined value by a predetermined unit when the current data is retransmission data and corresponds to the last transmission of the specific encoded packet; and iteratively decoding the current data within the maximum number of iterations.

20. The method of claim 19, further comprising:

determining whether previous data corresponds to a last transmission of a specific encoded packet according to previous HARQ information about the previous data;

determining whether early stop was applied to iterative decoding of the previous data when the previous data corresponds to the last transmission of the specific encoded packet; and determining the maximum number of iterations for the current data by decrementing the predetermined value by a predetermined unit when the previous data corresponds to the last transmission of the specific encoded packet and the early stop was not applied to the iterative decoding of the previous data.

21. The method of claim 20, further comprising:

maintaining the predetermined value as the maximum number of iterations when the current data is retransmission data and the current data does not correspond to the last transmission of the specific encoded packet; and maintaining the predetermined value as the maximum number of iterations when the previous data does not correspond to the last transmission of the specific encoded packet or the early stop was applied to the iterative decoding of the previous data.

22. An apparatus for controlling iterative decoding, the apparatus comprising:

a controller for determining whether current data to be decoded is retransmission data based on current Hybrid Automatic Repeat reQuest (HARQ) information necessary for a HARQ operation of the current data, determining whether the current data corresponds to a last transmission of a specific encoded packet when the current data is retransmission data, and determining a maximum number of iterations for the current data by incrementing a predetermined value by a predetermined unit when the current data is retransmission data and corresponds to the last transmission of the specific encoded packet; and a turbo decoder for iteratively decoding the current data within the maximum number of iterations.

23. The apparatus of claim 22, wherein the controller determines whether previous data corresponds to a last transmission of a specific encoded packet according to previous HARQ information about the previous data, wherein the controller determines whether early stop was applied to iterative decoding of the previous data when the previous data corresponds to the last transmission of the specific encoded packet, and wherein the controller determines the maximum number of iterations for the current data by decrementing the predetermined value by a predetermined unit when the previous data corresponds to the last transmission of the specific encoded packet and the early stop was not applied to the iterative decoding of the previous data.

24. The apparatus of claim 23, wherein the controller maintains the predetermined value as the maximum number of iterations when the current data is retransmission data and the current data does not correspond to the last transmission of the specific encoded packet, and maintains the predetermined value as the maximum number of iterations when the previous data does not correspond to the last transmission of the specific encoded packet or the early stop was applied to the iterative decoding of the previous data.

\* \* \* \* \*